United States Patent [19]
Chirovsky et al.

[11] Patent Number: 5,996,221
[45] Date of Patent: *Dec. 7, 1999

[54] METHOD FOR THERMOCOMPRESSION BONDING STRUCTURES

[75] Inventors: Leo Maria Freishyn Chirovsky, Bridgewater; John Edward Cunningham, Lincroft; Lucian Arthur D'Asaro, Madison; Keith Wayne Goossen, Aberdeen, all of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/766,215

[22] Filed: Dec. 12, 1996

[51] Int. Cl.$^6$ ...................................................... H05K 3/32
[52] U.S. Cl. ................................ 29/840; 29/832; 29/740; 228/180.22; 228/223
[58] Field of Search ............................. 29/832, 840, 740, 29/830; 228/223, 180.22; 361/771; 156/633; 438/108

[56] References Cited

U.S. PATENT DOCUMENTS

| | | | |
|---|---|---|---|
| 5,207,864 | 5/1993 | Bhat et al. | 156/633 |
| 5,386,624 | 2/1995 | George et al. | 29/832 |
| 5,406,025 | 4/1995 | Carlstedt | 29/832 X |
| 5,483,421 | 1/1996 | Gedney et al. | 361/771 |
| 5,638,597 | 6/1997 | Cutting et al. | 29/830 |
| 5,739,053 | 4/1998 | Kawakita et al. | 438/108 |
| 5,785,234 | 7/1998 | Weiss et al. | 228/223 |
| 5,813,115 | 9/1998 | Misawa et al. | 29/832 |
| 5,816,478 | 10/1998 | Kaskoun et al. | 228/180.22 |
| 5,873,161 | 2/1999 | Chen et al. | 29/830 |

*Primary Examiner*—Lee Young
*Assistant Examiner*—Rick Kiltae Chang
*Attorney, Agent, or Firm*—John M. Harman

[57] ABSTRACT

A method for thermocompression bonding structures together including structures having different coefficients of thermal expansion, for example, thermocompression bonding optical diode arrays or other semiconductor structures to silicon substrates to form electronic or optoelectronic devices. The method includes aligning and contacting the structures to be interconnected, thermocompressing the structures via their contact pad elements at a bonding temperature, establishing an encapsulation temperature, applying an encapsulant material between the bonded structures, and curing the encapsulant material at the encapsulation temperature. Conventional bonding processes, which treat encapsulation as a separate step apart from bonding processes, melt the bonded assembly together and include at least one thermal cycle in which the bonded assembly is cooled to room temperature and then is re-heated to the encapsulation temperature before applying the encapsulant material. The inventive method eliminates this thermal cycle by including encapsulation as an integral step in the thermocompression bonding process and therefore reduces or eliminates the possibility of damage to bonds or their multi-layered contact elements between the time of bonding and the time of encapsulation. Resultingly, the inventive method advantageously improves the quality and reliability of the resulting bonds within the formed device compared to bonds formed in a conventional manner.

22 Claims, 3 Drawing Sheets

METHOD FOR THERMOCOMPRESSION BONDING STRUCTURES

BACKGROUND OF THE INVENTION

1. Field of the Invention

The invention relates to the bonding of structures such as semiconductor or ceramic devices to one another.

2. Description of the Related Art

The interconnection of semiconductor devices and other structures during the manufacture of circuit chip assemblies typically involves bonding techniques. For example, such techniques include micro-bonding a semiconductor, optical, photonic, ceramic or other element structure to a substrate such as a silicon (Si), indium phosphide (InP) or other substrate to form an electronic or optoelectronic device.

One particular type of bonding is the micro-bonding of optical elements to semiconductor substrates to form an optoelectronic device. For example, it is possible to micro-bond an array of GaAs/AlGaAs optical diodes on a GaAs substrate to a semiconductor substrate such as a Si integrated circuit (IC) chip to form an optoelectronic chip assembly having an arrayed plurality of optical diodes.

In such assembly, each optical diode in the array has a pair of multi-layered, microcontact elements for bonding to a corresponding pair of bonding contacts within an array of bonding contacts on the Si substrate. After solder bumps are formed on one or both arrays of contact elements to be bonded, the structures are aligned, pressed together (tacked) and heated sufficiently to soften or melt the solder bumps for corresponding interconnections to occur. The device formed by the interconnection is then cooled for removal from the bonding apparatus.

However, because of the difference in the respective thermal expansion coefficients of, e.g., the GaAs optical diode array substrate and the Si substrate, mechanical stress often is imparted on the interconnections formed therebetween. Such stress can affect the quality of the interconnections, often resulting in poor quality solder connections or even some ruptures.

In an effort to combat this stress, an encapsulant material typically is applied between the two substrates and allowed to cure prior to final packaging, thus offering some measure of stability to the interconnections. However, any damage to interconnections that occurred prior to encapsulation cannot be repaired.

In cases where the GaAs optical diode array substrate is opaque to the conventional operating wavelength of the optical diodes, the substrate often is removed for proper operation of the device. Such removal is performed, for example, by etching. In such cases, the encapsulant material also protects the interconnections from the etchant in addition to the stability and/or strength provided to the interconnections. For example, see Goossen (U.S. Pat. No. 5,385,632), which is co-owned with this application.

The removal of the GaAs optical diode array substrate (leaving only the array of optical diodes) alleviates most of the mechanical stress within the manufactured optoelectronic device; however, any damage to connections that occurred during previous processing cannot be repaired.

Therefore, despite the stress-reducing-efforts of the encapsulant material and/or the removal of the GaAs optical diode array substrate, the resulting devices typically are still suffering from poor quality bond connections or from ruptures within the multi-layer, micro-contact elements.

Thus, it is desirable to have available a reliable, high yield bonding method that improves upon or overcomes stress-related problems associated with conventional bonding techniques as discussed above.

SUMMARY OF THE INVENTION

The invention is embodied in a method for thermocompression bonding structures together, for example, thermocompression bonding optical diode arrays or other semiconductor structures to silicon substrates to form electronic or optoelectronic devices. The method includes aligning and contacting the structures to be interconnected, thermocompressing the structures via their contact pad elements at a bonding temperature, establishing an encapsulation temperature, applying an encapsulant material between the bonded structures, and curing the encapsulant material at the encapsulation temperature. Conventional bonding processes, which treat encapsulation as a separate step apart from bonding processes, melt the bonded assembly together and include at least one thermal cycle in which the bonded assembly is cooled to room temperature and then is re-heated to the encapsulation temperature before applying the encapsulant material. The inventive method eliminates this thermal cycle by including encapsulation as an integral step in the thermocompression bonding process and therefore reduces or eliminates the possibility of damage to bonds or their multi-layered contact elements between the time of bonding and the time of encapsulation. Resultingly, the inventive method advantageously improves the quality and reliability of the resulting bonds within the formed device compared to bonds formed in a conventional manner.

DETAILED DESCRIPTION

Figure 1:
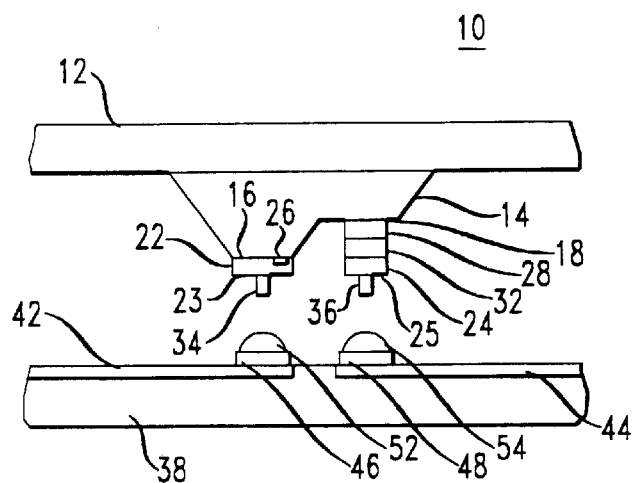
FIG. 1 is a cross-sectional view of a GaAs optical diode array substrate and a Si substrate used to form an optoelectronic device according to an embodiment of the invention prior to interconnection thereof.

In the following description, similar components are referred to by the same reference numeral for clarity throughout the drawings and the corresponding description.

The invention is described primarily in terms of a particular embodiment, namely, thermocompression bonding methods for manufacturing optoelectronic chip assemblies. However, the invention is not thus limited, as will be appreciated by those skilled in the art. For example, it is possible to use embodiments of the invention to interconnect any structures (including semiconductor and ceramic materials) having different coefficients of thermal expansion, whose interconnection methods include thermal cycling between process steps.

The inventive technique advantageously recognizes that thermal expansion stress causing poor interconnections is attributable to the thermal cycling steps within the bonding processes, particularly the cooling phase of thermal cycling process steps. Conventional bonding processes often viewed these interconnection failures as the result of incomplete or improperly-made bonds that are thought to be caused by improper tacking or insufficient heating, i.e., a poorly executed bonding procedure. Consequently, conventional processes tend to focus on improving the tacking, heating or other bonding procedure steps themselves, rather than the timing or relationships between those steps, in hopes of improving the quality of the bonded interconnections.

Figure 2:
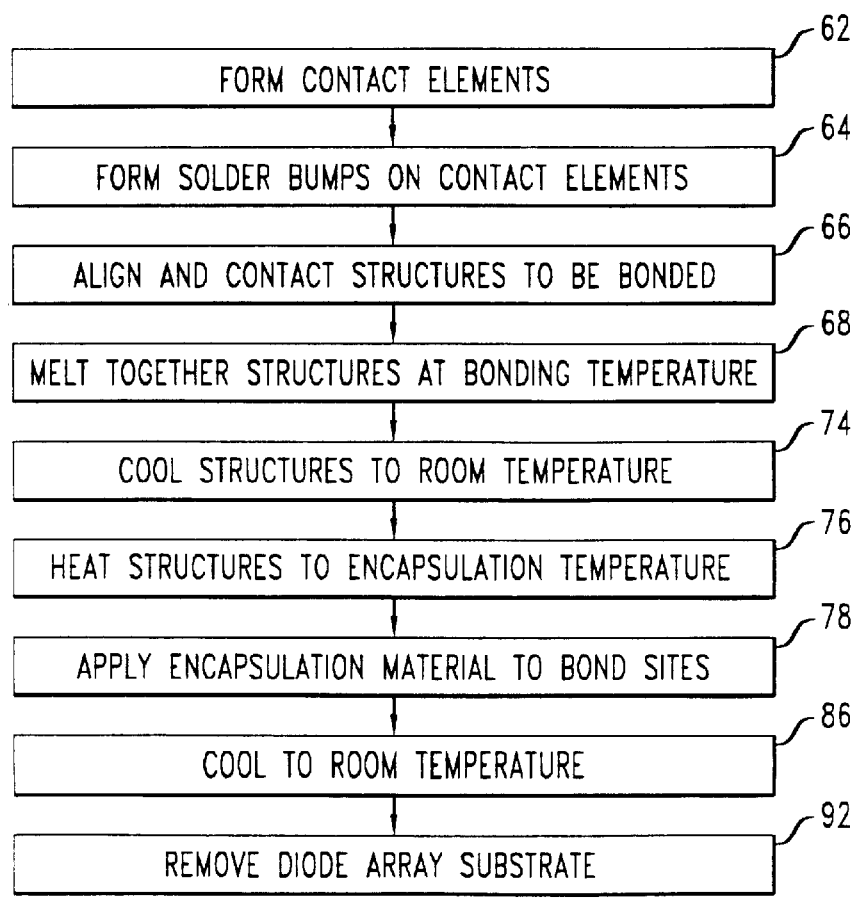
FIG. 2 is a simplified block diagram of a conventional process for thermocompression bonding structures together.
Figure 3:
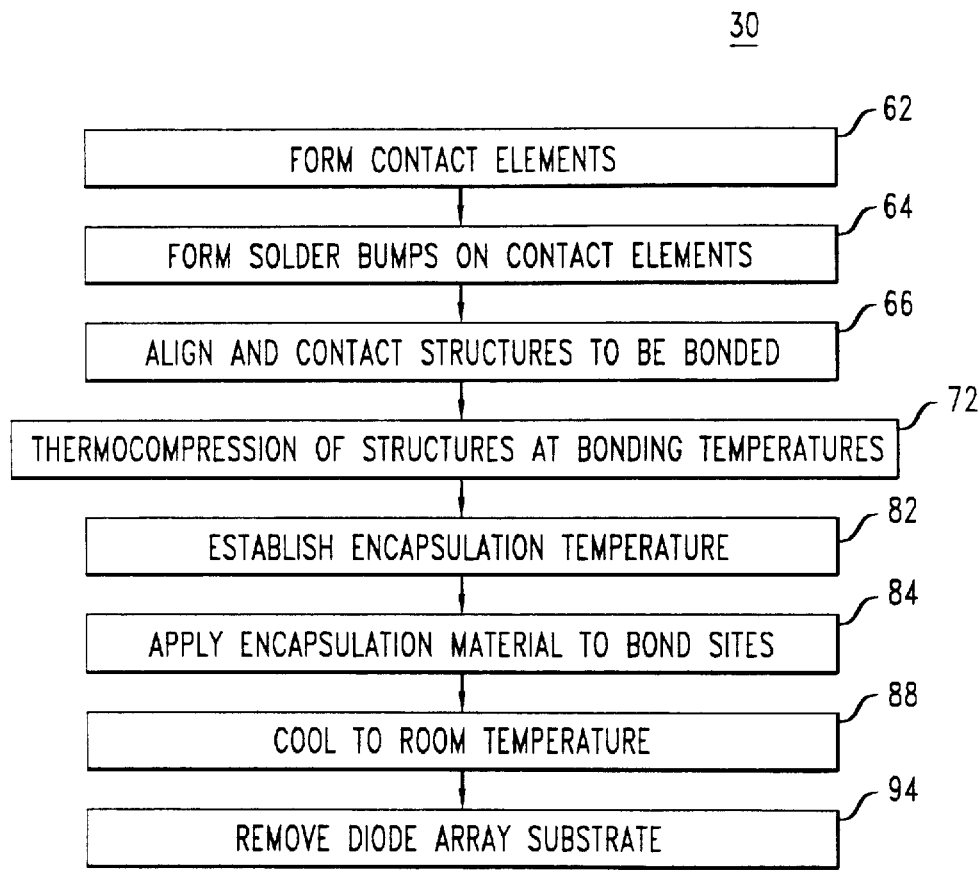
FIG. 3 is a simplified block diagram of a method for thermocompression bonding structures together according to an embodiment of the invention.

FIG. 1 illustrates the major components used in forming an optoelectronic chip assembly 10 as discussed previously. FIGS. 2–3 set forth block diagrams of methods used in forming an optoelectronic chip assembly 10 in a conventional manner (method 20 in FIG. 2) and according to an embodiment of the invention (method 30 in FIG. 3).

As shown in FIG. 1, an optical substrate 12 (e.g., a GaAs substrate) supports an optical diode 14 having an n-doped region (shown generally as 16) and a p-doped region (shown generally as 18) formed thereon. To facilitate bonding, n-doped region 16 has an electrically conductive contact element or pad 22 formed as shown in a conventional manner, such as by evaporation, sputtering and the like. For example, contact pad 22 is an approximately 1.0 micron ($\mu$m) or less thick layer of titanium (Ti), nickel (Ni) and gold (Au). Alternatively, chromium (Cr) is substituted for the Ti and/or platinum (Pt) is substituted for nickel (Ni). An exemplary contact pad 22 is comprised of, e.g., a 50–250 Å layer of Ti or Cr, a 100–1000 Å layer of Ni or Pt, and a 1500–5000 Å layer of Au. Also, n-doped region 16 includes an approximately 0.2 $\mu$m thick metal contact layer 26 formed as shown between n-doped region 16 and electrically conductive contact pad 22. Metal contact layer 26 is made of, e.g., germanium-nickel-gold (GeN/Au) or other suitable material.

Similarly, p-doped region 18 includes an electrically conductive contact element or pad 24 formed in a conventional manner as shown. Typically, pad 24 has a thickness of up to approximately 1.0 $\mu$m and is comprised of layers of Ti, Ni and Au, or is comprised of other suitable materials. An ohmic metal contact layer 28 and a gold or gold alloy pad layer 32 are formed in a conventional manner as shown between p-doped region 18 and electrically conductive contact pad 24.

For example, ohmic metal contact layer 28 is an approximately 0.2 $\mu$m thick layer of beryllium-gold (BeAu) or other suitable material and pad layer 32 is an approximately 1.50 $\mu$m thick layer of Au. The thicknesses of layers 28 and 32 may differ, but the total thickness of the two layers together must be sufficient to bring a lower surface 25 of pad 24 in approximate horizontal alignment with a corresponding lower surface 23 of pad 22.

In an alternative embodiment of the invention, contact pads 22 and 24 each have a gold post 34 and 36, respectively, formed thereon as shown. Gold posts 34, 36 are used, e.g., as a compression stop and to limit spreading of solder bumps during the bonding process. Gold posts and their use in bonding processes are disclosed in detail, for example, in co-pending application Ser. No. 08/633,992, filed Apr. 19, 1996 and assigned to the assignee of the present invention.

Typically, it is desirable to form contact pads 22 and 24 as small as possible and as close together as possible to reduce the effective capacitance and series resistance of each optical diode 14. However, doing so also increases vulnerability to stress damage.

In a typical arrangement, optical substrate 12 has a lateral dimension of approximately 6×6 or 36 mm² and includes an array of optical diodes dimensioned approximately 5.4×5.4 mm². Thus, with approximately 80 $\mu$m spacing between the center of adjacent optical diodes in the array, an array of approximately 4352 optical diodes typically is formed thereon.

A semiconductor substrate 38, e.g., a Si IC device, supports pads 42, 44 formed therein as shown and barrier metal pads 46, 48 formed on pads 42, 44, respectively, as shown. Pads 42, 44 are, e.g., aluminum alloy layers such as aluminum-silicon (AlSi), aluminum-copper (AlCu) or aluminum-silicon-copper (AlSiCu) having a thickness in the range of approximately 0.4–1.0 $\mu$m and formed in the IC foundry. Barrier metal pad layers 46, 48 are subsequently added in a conventional manner. Each layer typically has a thickness of up to approximately 1.0 $\mu$m and is comprised of layers of Ti, Ni and Au, or is comprised of other suitable materials. Barrier metal pads 46, 48 are dimensioned and arranged to align with corresponding optical diode contact pads 22, 24 of optical substrate 12 when substrates 12 and 38 are interconnected.

Although the formation of single or multi-layer arrangements requires layers of varying thicknesses, the lateral dimensions of conventional contact elements typically have similar dimensions and are within the range from approximately 10 $\mu$m×10 $\mu$m to approximately 20 $\mu$m×20 $\mu$m. For example, contact pads 22 and 24, ohmic metal contact layer 28 and pad contact 32 have individual lateral dimensions of approximately 15×15 $\mu$m². Also, typically, for a given optical diode, the spacing between edges of the n-doped and p-doped contact elements is approximately equal to one dimension of the pads. That is, for contact pads 22, 24 dimensioned approximately 15×15 $\mu$m, the spacing therebetween is approximately 15 $\mu$m.

A pair of solder bumps 52, 54 typically are formed in a conventional manner on pads 42, 44 as shown. Alternatively, a second pair of solder bumps (not shown) are formed on contact pads 22, 24 to provide additional solder for bonding the corresponding contact pads. However, it is possible for pads 22, 24 not to have any solder bumps or gold posts (discussed previously) formed thereon.

In a conventional manner, optoelectronic chip assembly 10 is manufactured by interconnecting the optical substrate and semiconductor substrate structures described previously, for example, according to a method depicted in block diagram form in FIG. 2. A first step 62 of a conventional method 20 is to form contact elements on the structures to be bonded together. Contact elements include, e.g., barrier metal pads 46, 48 formed on support pads 42, 44, respectively, of semiconductor substrate 38 and contact pads 22, 24 formed on optical substrate 12 via optical diode 14.

Contact elements are formed, e.g., by conventional evaporation techniques, such as e-beam evaporation, sputtering, thermal evaporation, or other suitable process. The contact elements are multi-layered and include other layers such as, e.g., ohmic metal contact layers 26, 28 and gold pad layer 32.

The next step 64 involves forming solder bumps, e.g., forming solder bumps 52, 54, on contact elements such as on barrier metal pads 46, 48 or, alternatively, forming solder bumps on contact pads 22, 24. The solder bumps are formed, e.g., by conventional processes such as evaporation. However, any suitable solder bump formation process is capable of being used. Conventional solder materials include, e.g., tin (Sn), gold-plated tin, lead/tin (Pb/Sn) and lead/tin alloys, and indium (In).

The next step 66 is to align and contact the substrates that are to be bonded together. Step 66 involves positioning the substrates so that their respective contact elements are aligned and bringing the substrates together so that corresponding contact elements touch.

Once the contact elements of the substrates have been brought together, the actual bonding step occurs. In conventional processes, a bonding step 68 involves heating the structures sufficiently to soften or melt the solder between their respective contact elements in a manner that forms interconnections therebetween.

Figure 4:
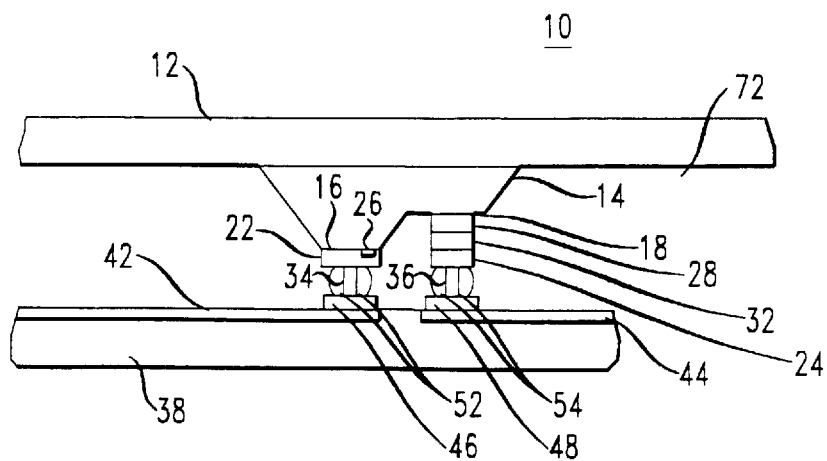
FIG. 4 is a simplified, cross-sectional view of the optoelectronic device of FIG. 1 during fabrication according to an embodiment of the invention just after bonding together the GaAs optical diode array substrate and the Si substrate.

In the inventive method, a thermocompression step 68 is performed in which adequate pressure is applied to the structures in the presence of a bonding temperature to sufficiently bond the structures together to form the assembly shown generally in FIG. 4. A typical pressure for bonding structures such as those described above is approximately 1.25–7.00 mg/$\mu$m$^2$ based on the cross-sectional area of the surfaces being bonded, i.e., the cross-sectional area of the solder pads. However, the pressure range often is between 2.00–5.00 mg/$\mu$m$^2$.

The bonding temperature typically is below the melting point of solder and below the melting point of the bonding contact elements, e.g., pads 22, 24, 46, 48. For example, using tin solder, which has a melting temperature of approximately 232° C., the bonding temperature typically is within the range between approximately 140° C. to 170° C. The bonding temperature is established in a conventional manner, for example, by a commercial bonding machine.

As shown in FIG. 4, due to the presence of the bonding elements, thermocompression step 68 forms a low-profile gap 72 between substrates 12 and 38. Typically, low-profile gap 72 is approximately 4–6 $\mu$m thick. The surface area of low-profile gap 72 depends on the size of the substrates, but typically is greater than 25 mm$^2$ in some applications.

As shown, barrier metal pads 46, 48 of substrate 38 are bonded to contact pads 22, 24 of optical diode 14, which are formed on substrate 12. As discussed previously, alternatively, gold or gold alloy posts 34, 36 formed on contact pads 22, 24 are used to limit spreading of the solder during bonding.

Referring again to FIGS. 2–3, in conventional processes (e.g., as shown in FIG. 2), once the substrates to be interconnected are melted together, the assembly is cooled to keep the interconnections intact. In conventional bonding processes, such a cooling step 74 (shown as step 74 in FIG. 2) is performed by removing the bonded assembly from the apparatus used for bonding (e.g., a commercial bonding machine) and allowing the bonded assembly to cool to room temperature (e.g., within the range from approximately 22° C. to 25° C).

Figure 5A:
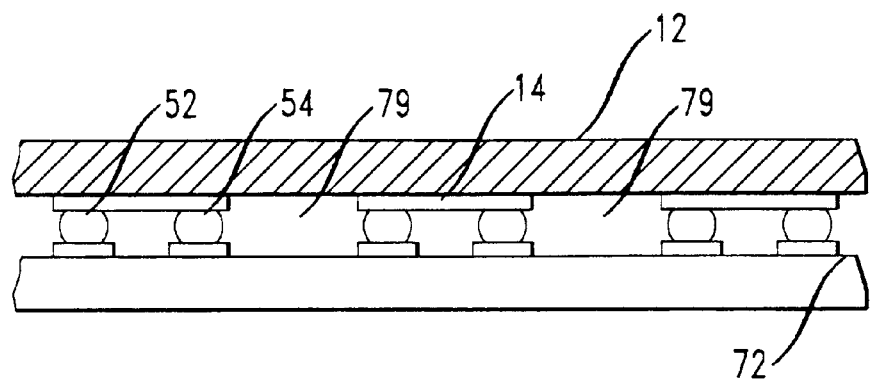
FIG. 5a is a simplified, cross-sectional view of an optoelectronic device during fabrication according to an embodiment of the invention prior to removal of the GaAs optical diode array substrate.

Subsequent to cooling the structure to room temperature via cooling step 74, conventional bonding processes heat the bonded assembly to an encapsulation temperature (e.g., heating step 76 shown in FIG. 2) for application of the encapsulant material (e.g., applying step 78 shown in FIG. 2) into low-profile gap 72. Such heating step involves transferring the bonded assembly to an appropriate apparatus equipped to heat the bonded structure to the encapsulation temperature and apply the encapsulant material. Application of the encapsulant material into low-profile gap 72 is performed in a conventional manner. The resulting assembly is shown generally in FIG. 5a.

The encapsulation temperature, which typically is just below the bonding temperature and well above room temperature, is the temperature at which the flow of the encapsulant material is most effective. For example, during the formation of optoelectronic chips with optical diodes arrays, the encapsulation temperature typically is within the range from approximately 100° C. to 120° C.

As discussed previously, the encapsulant material (shown generally as 79) seeks to mitigate mechanical stress by encapsulating, immobilizing and sealing the bonded interconnections in cases where the substrate is not removed. In cases where the GaAs optical diode array substrate is to be removed, the encapsulant material additionally protects the interconnections and other circuitry from the etchants used in removing the substrate. Although it is possible for the encapsulant material to effectively secure bonds whose quality is initially mediocre, the encapsulant material does not mitigate damaged bonds, i.e., interconnection damage resulting from previous processing such as prior thermal cycling.

Figure 5B:
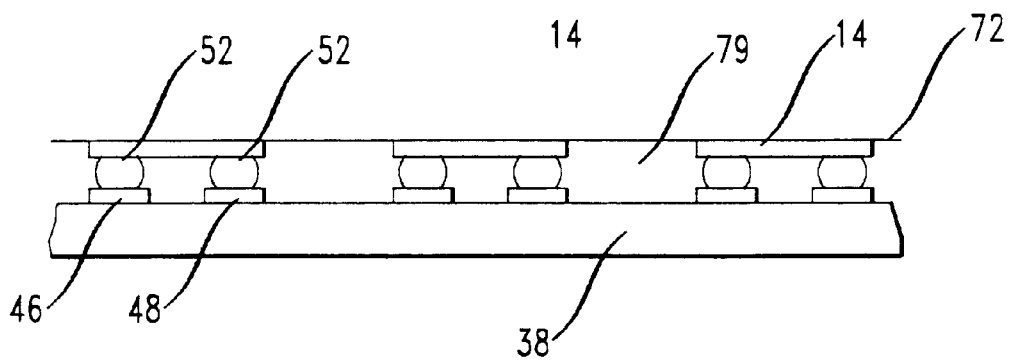
FIG. 5b is a simplified, cross-sectional view of an optoelectronic device during fabrication according to an embodiment of the invention subsequent to the removal of the GaAs optical diode array substrate.

The encapsulant material is any suitable thermosetting material, e.g., an epoxy having a viscosity low enough to fill low-profile gap 72 and that is curable to a hardness that effectively immobilizes the bonded interconnections. Once the encapsulant material fills low-profile gap 72 and is cured as desired, optical diode array substrate 12 is removed, e.g., by etching or other suitable technique, to form the device shown generally in FIG. 5b.

The invention is based on the discovery that the quality of the bonded interconnections is improved upon elimination of any thermal cycles occurring after bonding and prior to encapsulating the interconnection sites. As a result, the yield of interconnected assemblies is improved. Specifically, thermal cycles comprise the steps of cooling the bonded assembly from the bonding temperature to room temperature after bonding, and subsequently heating the assembly to the encapsulation temperature thereafter. Such thermal cycles induce strain and damage within the bonded assembly, particularly at the interconnection sites and within the multi-layer, micro-contact elements.

According to embodiments of the present invention, once the substrates are brought together under sufficient bonding pressure, the temperature of the bonded assembly is adjusted from the established bonding temperature directly to the encapsulation temperature (rather than cooling the bonded assembly from the bonding temperature to room temperature and then heating the bonded assembly at a later time from room temperature to the encapsulation temperature). In this manner, embodiments of the present invention eliminate thermal cycles occurring conventionally between the bonding and encapsulating steps. As mentioned previously, the inventive method incorporates encapsulation into the bonding process, unlike conventional processes that typically treat bonding and encapsulation as two separate operations.

According to embodiments of the invention, the difference between the bonding temperature and the encapsulation temperature typically is within the range from approximately 20° C. to 70° C. Depending on the materials used, it is possible to expand both the limits of this range as needed. However, it should be understood that, in general, as the temperature difference between the bonding temperature and the encapsulation temperature is increased, the possibility increases that the ill effects of thermal cycling will be introduced to the extent that a decreased yield of stress-free bonds results among, e.g., an array of bonds. Therefore, the degree of expansion of this temperature difference is dictated by the willingness to accept decreased yield among stress-free bonds.

As shown in FIG. 3, after thermocompression step 68, an encapsulation temperature is established (shown as step 82) for the device. In the manner according to the invention, step 82 according to an embodiment of the invention is performed instead of the cooling and heating steps 74 and 76, respectively, of conventional processes.

As an example, the encapsulation temperature is established for the bonded assembly by transferring the bonded assembly from an environment having an established bonding temperature to an environment having an established encapsulation temperature in such a way that the temperature of the bonded assembly changes directly from the bonded temperature to the encapsulation temperature. Alternatively, the bonded assembly remains in the bonding temperature environment (e.g., on a commercial bonding machine) and the temperature is adjusted directly to the encapsulation temperature.

Once the encapsulation temperature is established, the encapsulant material is applied in a conventional manner within low-profile gap 72. Such step is shown generally, e.g., as applying step 78 in the conventional process of FIG. 2 and applying step 84 in the inventive process as shown in FIG. 3. The encapsulation temperature is maintained for a duration sufficient to cure the encapsulant material (e.g., 0.50 hours), thus stabilizing and providing added strength to the interconnections therein.

As previously discussed, strain and damage within the bonded assembly is caused by thermal cycling, e.g., the thermal cycle created by cooling step 74 and heating step 76 in conventional processes. According to an embodiment of the invention, inventive step 82 eliminates thermal cycling by adjusting the bonding temperature after bonding directly to the encapsulation temperature for applying the encapsulant material.

In some cases, the bonded assembly is used in an application in which the assembly undergoes repeated thermal cycling, which possibly causes even further damage to the bonded interconnections. In those cases, conventional bonding processes typically apply an encapsulant material between the two substrates and allow it to cure prior to final packaging but long after the first thermal cycle, thus immobilizing interconnections that may have been damaged by previous thermal cycling.

Conventional bonding processes treat encapsulation as a process separate and apart from bonding. Therefore, upon completion of the bonding process, the structure is cooled (typically to room temperature) before participating in the subsequent encapsulation process. In this conventional manner, at least one thermal cycle takes place between bonding and encapsulation. By comparison, according to the invention, thermocompression and encapsulation are performed as part of a single process (i.e., encapsulation is incorporated as an integral part of the bonding process). In this manner, thermal cycling between bonding and encapsulation is advantageously eliminated, thus improving the quality of the bonded assembly.

Upon curing the encapsulant material within the bonded assembly, the bonding process is completed by cooling or allowing the assembly to cool to room temperature. Such step is shown generally in FIGS. 2 and 3 as cooling steps 86 and 88, respectively.

Alternatively, in some cases, the GaAs optical diode array substrate 12 is removed to expose the diode arrays. Optical diode array substrate 12 is removed, e.g., by wet etching or other suitable technique such as reactive ion etching (RIE). Such removal is shown generally as removing steps 92 and 94 in FIGS. 2 and 3, respectively.

The removal of substrate 12 alleviates some of the mechanical stress inflicted upon the interconnections, specifically that portion of the stress caused by the thermal expansion and contraction of substrate 12 during thermal cycling. However, any damage to interconnections that occurred prior to the removal of substrate 12 (e.g., damage caused by thermal cycling during previous processing) cannot be mitigated by the removal of substrate 12.

However, optical diode operating wavelengths are being used, e.g., wavelengths that are not impervious to the GaAs optical diode array substrate. Therefore, it is not always necessary to remove the optical diode array substrate for proper operation of the fabricated device.

The improved quality and increased yield afforded by the inventive method allows large arrays of (i.e., thousands) of reliable connections to be made with otherwise relatively fragile bonds. Additionally, it is possible that the inventive method described herein is useful for protecting fragile bonds from other sources of stress (i.e., from sources of stress other than thermal cycling) occurring randomly or systematically.

It will be apparent to those skilled in the art that many changes and substitutions can be made to the embodiments of the bonding methods herein described without departing from the spirit and scope of the invention as defined by the appended claims and their full scope of equivalents.

What is claimed is:

1. A method for bonding structures together, said method comprising the steps of:

providing a first structure and a second structure, at least one of said structures having at least one contact element formed thereon;

bonding at least one of said contact elements of said first structure to a corresponding contact element of said second structure in such a way that a low-profile gap is formed between said first and second structures, said bonding step achieving a bonding temperature and pressure where at least one thermocompression bond is formed between said first and second structures;

establishing an encapsulation temperature for said first and second structures, wherein the encapsulation temperature differs from the bonding temperature;

applying an encapsulant material into said low-profile gap after the formation of the at least one thermocompression bond; and maintaining said encapsulation temperature in such a way that said encapsulant material encapsulates said at least one bond, wherein thermal cycling to room temperature does not occur between the establishment of the bonding temperature and the establishment of the encapsulation temperature.

2. The method as recited in claim 1, wherein said bonding temperature is below a melting point of said contact elements.

3. The method as recited in claim 1, wherein said bonding temperature is in a range from approximately 140° C. to 170° C.

4. The method as recited in claim 1, wherein said encapsulation temperature is below said bonding temperature.

5. The method as recited in claim 1, wherein said encapsulation temperature is in a range from approximately 100° C. to 120° C.

6. The method as recited in claim 1, wherein said first structure has a first coefficient of thermal expansion and second structure has a second coefficient of thermal expansion different from said first coefficient of thermal expansion.

7. The method as recited in claim 1, further comprising a step of forming a solder bump on at least one of said contact elements.

8. The method as recited in claim 1, wherein said encapsulant material is a thermosetting material.

9. The method as recited in claim 1, wherein said maintaining step further comprises curing said encapsulant material within said low-profile gap in such a way that said encapsulant material stabilizes said at least one bond.

10. The method as recited in claim 1, wherein at least one of said first and second structures is selected from a group consisting of semiconductor, ceramic and optical structures.

11. The method as recited in claim 1, further comprising, after said maintaining step, a step of cooling said first and second structures to a room temperature, wherein said room temperature is in a range from approximately 22° C. to 25° C.

12. A method for forming an optoelectronic device, said method comprising the steps of:
providing an optical substrate having an array of photonic components, at least one of said photonic components having at least one contact pad formed thereon, said optical substrate having a first coefficient of thermal expansion;
providing a semiconductor substrate having an array of contact pads formed thereon and corresponding to said array of contact pads of said photonic components, said semiconductor substrate having a second coefficient of thermal expansion different from said first coefficient of thermal expansion;
bonding at least one of said contact pads of said photonic components of said optical substrate to a corresponding contact pad of said semiconductor substrate in such a way that a low-profile gap is formed therebetween, said bonding step achieving a bonding temperature and pressure where an optoelectronic device is formed having at least one thermocompression bond formed therein;
establishing an encapsulation temperature for said optoelectronic device, wherein the encapsulation temperature differs from the bonding temperature;
applying an encapsulant material into said low-profile gap after the at least one thermocompression bond is formed; and
maintaining said encapsulation temperature in such a way that said encapsulant material encapsulates said at least thermocompression one bond formed in said optoelectronic device to stabilize said at least one bond,
wherein no thermal cycling to room temperature occurs between the formation of the at least one thermocompression bond and the encapsulation of the at least one thermocompression bond.

13. The method as recited in claim 12, wherein said bonding temperature is below a melting point of said contact elements.

14. The method as recited in claim 12, wherein said bonding temperature is in a range from approximately 140° C. to 170° C.

15. The method as recited in claim 12, wherein said encapsulation temperature is below said bonding temperature.

16. The method as recited in claim 12, wherein said encapsulation temperature is in a range from approximately 100° C. to 120° C.

17. The method as recited in claim 12, further comprising a step of forming a solder bump on at least one of said contact elements.

18. The method as recited in claim 12, further comprising a step of forming contact pads on at least one of said substrates.

19. The method as recited in claim 12, further comprising, after said maintaining step, a step of cooling said optoelectronic device to a room temperature, wherein said room temperature is in a range from approximately 22° C. to 25° C.

20. The method as recited in claim 12, further comprising a step of removing said optical substrate from said optoelectronic device.

21. The method as recited in claim 20, further comprising, after said step of removing said optical substrate from said optoelectronic device, a step of removing said encapsulant material from said optoelectronic device.

22. The method as recited in claim 12, wherein said optical substrate includes a GaAs material and wherein said array of photonic components includes optical diodes.

* * * * *